United States Patent [19]

Gendernalik

[11] Patent Number: 4,614,385
[45] Date of Patent: Sep. 30, 1986

[54] CIRCUIT BOARD STORAGE APPARATUS

[76] Inventor: Robert A. Gendernalik, 2747 Union Ave., San Jose, Calif. 95124

[21] Appl. No.: 679,892

[22] Filed: Dec. 10, 1984

[51] Int. Cl.4 .................... A47B 63/00; H05K 7/16
[52] U.S. Cl. .................... 312/320; 312/244; 312/306; 211/41
[58] Field of Search .............. 312/320, 301, 306, 184, 312/244; 211/41, 46, 50

[56] References Cited

U.S. PATENT DOCUMENTS

| | | | |
|---|---|---|---|
| 2,223,978 | 12/1940 | Dew | 211/50 |
| 2,660,506 | 11/1953 | Wright | 312/306 |
| 2,962,335 | 11/1960 | Benson | 312/184 |
| 3,197,731 | 7/1965 | Beale et al. | 211/41 |
| 3,467,891 | 9/1969 | Mogle | 312/320 |
| 3,728,662 | 4/1973 | Puri | 312/320 |
| 3,891,093 | 6/1975 | Petrie | 211/46 |
| 4,002,381 | 1/1977 | Wagner et al. | 312/320 |
| 4,261,465 | 4/1981 | Thomas | 211/41 |
| 4,382,517 | 5/1983 | Welsch | 211/41 |
| 4,385,781 | 5/1983 | Welsch et al. | 211/41 |

FOREIGN PATENT DOCUMENTS 1354308  1/1964  France ............................ 312/320

Primary Examiner—Victor N. Sakran
Attorney, Agent, or Firm—Michael J. Hughes

[57] ABSTRACT

The present invention in its preferred embodiment, is a circuit board storage apparatus (6) including a clamping mechanism (10) having two jaw handle members (12), and a pair of contact jaw portions (18 and 20) which are held in a hinged juxtaposition by a hinge pin (14). The clamping mechanism (10) is adapted to grasp a printed circuit board (8). The apparatus (6) is further provided with a support and protective structure (30) which includes a pair of parallel rails (32), having notches to support the structure (30) on a frame (50), and a pair of protective sheets (38) for preventing physical abrasion and electrical damage to the circuit board (8). The entire apparatus (6) is adapted to be enclosed in a drawer (60) or cabinet for easy storage of multiple boards (8). The primary usage of the apparatus is in situations where an inventory of circuit boards must be maintained for quick retrieval, primarily in the electronic manufacturing and maintenance industries.

18 Claims, 4 Drawing Figures

CIRCUIT BOARD STORAGE APPARATUS

TECHNICAL FIELD

The present invention relates generally to storage devices and more particularly to the high density storage of printed circuit boards.

BACKGROUND ART

Electronic technology is a field that has shown remarkable advances in the recent past. One of the significant innovations in the field has been the printed circuit board. With this innovation, even very complex circuitry can be reduced from a bulky mass to an easy-to-handle planar unit known as a printed circuit board. The boards eliminate the requirements for bulky wiring and provide consistent spatially compact structures for handling complex tasks. The boards can simply be "plugged" into electronic systems, greatly facilitating the design, manufacture, and repair of electronic equipment. For repair functions, the modular aspects of the boards greatly simplify the repair process. New boards can simply be plugged in the place of the malfunctioning units and the old defective elements can be repaired off line with little down time to the function of the equipment.

A byproduct of the "plug-in," modular, aspect of the circuit boards is that it becomes necessary to maintain an inventory of boards on hand. A minimum requirement would be two or more of each type of board utilized in repair and maintenance operations. In an operation of any complexity, storage of the boards can become a problem.

Storage is a problem common to many business environments. Not only storage of materials, such as circuit boards, but also of peripheral items, such as paperwork. One aspect common to nearly all business situations is that storage space is expensive; hence myriad systems have been designed with the goal of higher density storage in mind.

Two such systems of interest are the hanging filing device disclosed in U.S. Pat. No. 2,223,978, issued to Marcus C. Dew, and the friction type binder disclosed in U.S. Pat. No. 2,869,210, issued to Oscar Kain Schneider. These two systems both show methods of storage by vertical suspension. The Dew device uses clips suspended from a rod to support the stored items. The Schneider system uses a pair of support rods on a rack to suspend the stored product.

There are also inventions dealing directly with the storage of printed circuit boards, two of which are U.S. Pat. Nos. 4,382,517, issued to John H. Welsch, and U.S. Pat. No. 4,385,781, issued to John H. Welsch and Robert J. Carver. Both of these devices allow high density storage of circuit boards of a given size.

These prior art devices all have shortcomings when applied to storage of circuit boards of varying sizes. The Dew and Schneider disclosures both relate to storage of paper products. The clamping and storage mechanisms were designed with that in mind. No electrical aspects were considered, and hence there is no provision for protection from static charge accumulation. There is also no provision for the increased weight and fragility factors present with circuit board applications.

Also, since the Dew and Schneider inventions were intended for the storage of files of greatly varying thicknesses, the clamping devices are spring-loaded. This creates a more complex mechanism than is necessary for storage of items of uniform, or nearly uniform, thickness.

The main disadvantage of the Welsch inventions, at least for the presently desired applications, is that there is no adequate provision made for variation in the dimensions of length and width. These are dimensions that will significantly differ among various printed circuit boards adapted for varying purposes. The Welsch devices consider the uniform thickness of the boards, but require adjustment for length variation. This, of course, rules out the possibility of the storage of different sized boards in a single device.

None of the prior art storage devices provide the flexibility necessary to store circuit boards of varying length and width. The prior art also makes no specific provision for protection from static charge buildup.

DISCLOSURE OF INVENTION

Accordingly, it is an object of the present invention to provide a system that will allow high density storage of printed circuit boards.

It is a further object of the present invention to provide for the storage of various sizes of boards in a single device.

Another object of the present invention is to provide a device that protects the boards from detrimental static charge accumulation.

A further object of the present invention is to provide for direct vertical removal such that the probability of impact to the delicate surface elements of the circuit board is minimized.

Briefly, a preferred embodiment of the present invention is a printed circuit board storage system. The system consists of a lockable clamping mechanism supported by two parallel rails. The board is held in place by the lower jaws of the clamping mechanism. The jaws are coated with a pliable gripping substance, such as polyethylene, to increase friction and thereby enhance the jaws' gripping capability. The upper structure of the clamping mechanism provides grasping handles for the mechanism as a whole as well as serving as the operational elements for manipulating the jaws. The length of the rails will be determined by the largest board required for a given application. Attached to both rails will be sheets of a flexible, conductive material. The rails will be notched at both ends to provide a stable position on top of the storage frame. The storage frame includes opposing parallel surfaces, either rods or the upper edges of panels, which provide vertical support for the rails. These frames may, in one preferred embodiment, be enclosed in a cabinet with multiple drawers, the number depending on the particular application. This modular design allows for high capacity and maximum flexibility within a single storage apparatus. The preferred material for the frame and cabinet will be an electrically conductive metal or a structural plastic provided with conductive coating or weaving. The cabinet may also be provided with a nitrogen purge option to minimize chemical degradation of the sensitive components.

An advantage of the present invention is that it provides for convenient, high density storage of printed circuit boards.

Another advantage of the present invention is that it allows the storage of boards of various sizes in one device.

A further advantage of the present invention is that it provides the boards with protection from the buildup of static charge.

Yet another advantage of the present invention is that the modular design allows for variable total capacity and easy expansion.

A still further advantage of the invention is that the board is installed in the clamping mechanism in ample space situations and is already protected by the side sheets when placed into the frame.

Still another advantage of the present invention is that insertion to and removal from the storage frame is accomplished in a planar, vertical manner, which minimizes impact damage to the components which may be mounted upon the boards.

These and other objects and advantages of the present invention will become clear to those skilled in the art in view of the description of the best presently known mode of carrying out the invention and the industrial applicability of the preferred embodiment as described herein and as illustrated in the several figures of the drawing.

BEST MODE OF CARRYING OUT INVENTION

Figure 1:
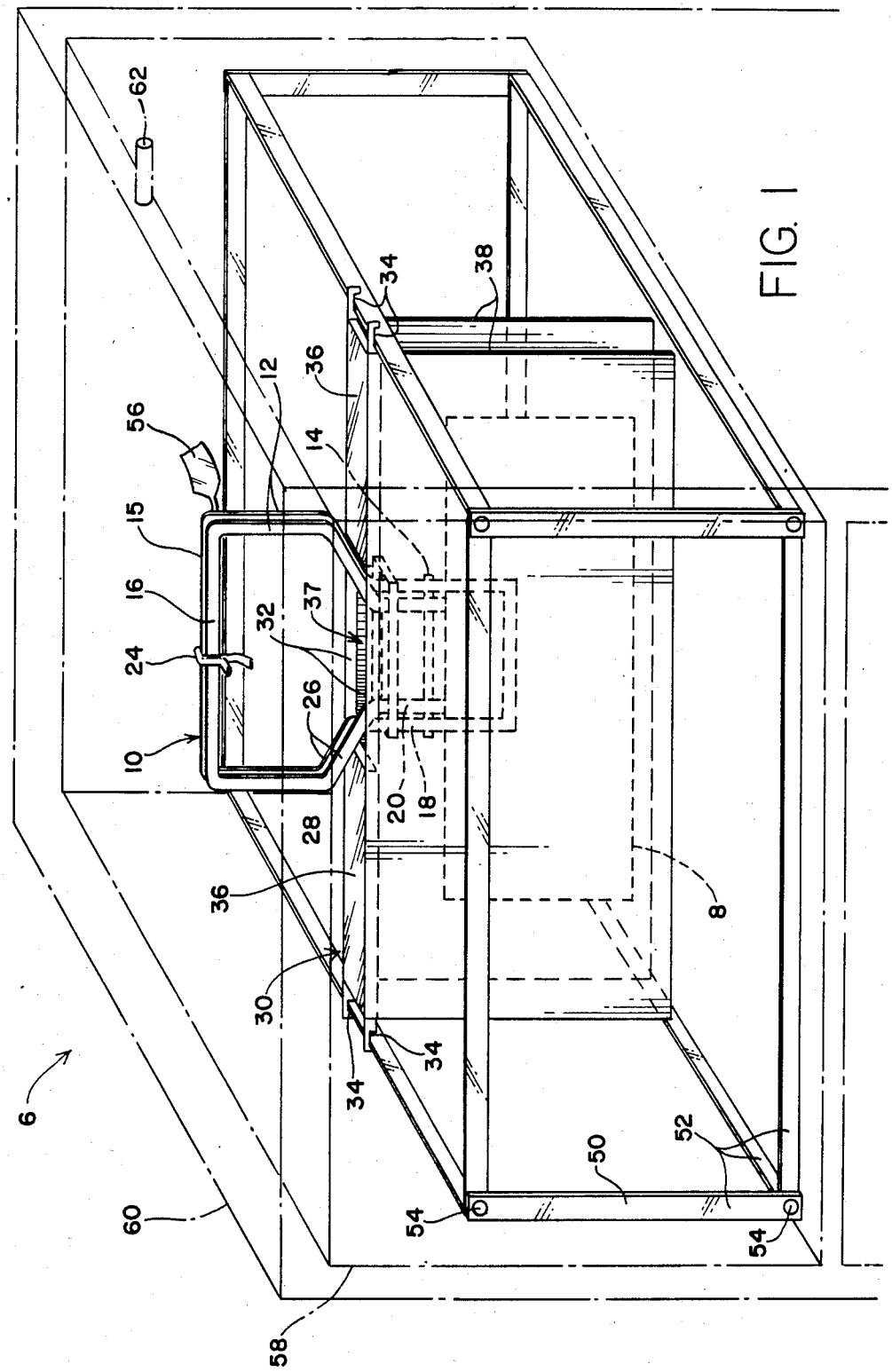
FIG. 1 is a perspective view of a printed circuit board storage system apparatus according to the present invention, illustrated as contained within an enclosing cabinet (shown in phantom)

The present invention is a printed circuit board storage system apparatus directed to providing an efficient, protective and flexible system of storage. The preferred embodiment of the invention is illustrated in the drawing and described herein.

The following description of the system refers to FIG. 1 unless otherwise noted. The overall system includes, as a major component, a circuit board support apparatus 6. A printed circuit board 8 is held in place within the support apparatus 6 by a clamping mechanism 10.

Figure 2:
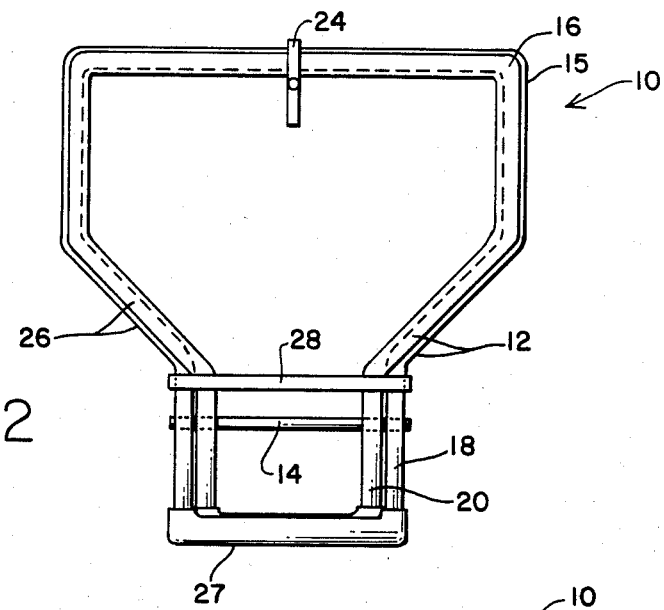
FIG. 2 is a front plan view of the clamping mechanism of FIG. 1, shown in a closed and locked position.
Figure 3:
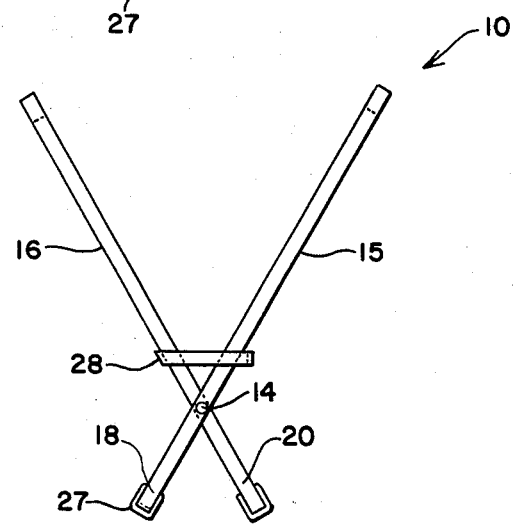
FIG. 3 is a side elevational view of the clamping mechanism of FIG. 2, shown in an open position.
Figure 4:
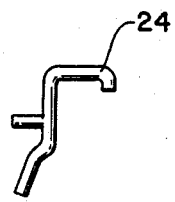
FIG. 4 is a side elevational view of the locking device element of the clamping mechanism of FIG. 2.

The clamping mechanism 10 consists of two jaw/handle members 12 joined by a hinge pin 14. Two symmetrical handle portions 15 and 16 are formed on the jaw/handle members 12 to grasping elements by which mechanism 10 may be transported. The handles 15 and 16 also serve as the manipulative elements for operating a pair of contact jaws portions 18 and 20 which form the opposite end of the jaw/handle member 12 from the handles 15 and 16. A locking device 24 (as shown in greater detail in FIGS. 2 and 4) is provided to secure the handles 15 and 16 in a closed position to provide the clamping force which retains the printed circuit board 8 in place. This permits the user to transport the device as at an approximately 45° angle from the handle 15 and 16 and jaw 18 and 20 portions. In this embodiment, the handles 16 are 12.5 cm (5 in.) long by 5.0 cm (2 in.) high. Each connecting segment 26 is 3.8 cm (1.5 in.) long. The contact jaws 18 and 20 are 5 cm (2 in.) high. The outer jaw 18 is 7.5 cm (3 in.) long; the inner jaw 20 is 6.3 cm (2.5 in.), so that a nesting is possible. The jaws 18 and 20 are coated with a pliable gripping coating 27 adapted to increase friction, thereby enhancing their gripping capability. A support bar 28 is also attached to the outer contact jaw 18 to restrain the degree of opening of the jaws 18 and 20. The clamping mechanism 10 is detailed in FIGS. 2 and 3.

A further purpose of the support bar 28 is to raise a board enclosure 30, formed of the remaining elements of the device 6, when the clamping mechanism 10 is lifted by the handles 16. The board enclosure 30 is formed as follows. Two identical parallel rails 32 are provided, each rail 32 having a notch 34 formed at each end. The rails 32 are made from conductive metal strips. $\frac{3}{8}$ in. wide. The length of the rails 32 will be determined by the particular application, and in the embodiment shown are 31 cm (12$\frac{3}{4}$ in.) long, including the notched portions. The rails 32 are separated by a pair of spacer blocks 36. Each spacer block 32 is $\frac{1}{2}$ inch wide. The length of the blocks 36 is such that a 11.3 cm (4$\frac{1}{2}$ in.) open channel 37 remains in the middle of the enclosure 30. The clamping mechanism 10 is placed inside this open channel 37, with the handles 16 resting on the blocks 36. The blocks 36 support the clamping mechanism 10 when the device is stored. When the clamping mechanism 10 is lifted by the handles 16, the support bar 28 contacts the rails 32, allowing the device to be lifted as a single entity.

The printed circuit board 8 is shielded while contained within in the board enclosure 30 by a pair of opposing protective sheets 38. The protective sheets 38 are attached to the rails 32. The sheets 38 are made of a flexible, conductive material. The dimensions of the protective sheets 38 will be determined by the largest printed circuit board 8 utilized in a given application, and in this embodiment are 27.5 cm (11 in.) long and 21.3 cm (8$\frac{1}{2}$ in.) high.

When stored, the board enclosures 30 rest on a storage frame 50. The notches 34 serve to anchor the board enclosures 30 in place. The storage frame 50 is constructed of a plurality of flat conductive metal bars 52, joined at the corners by fastening devices 54 in order to form a boxlike structure. In this embodiment, the frame is 27.5 cm (11 in.) long, 21.3 (8$\frac{1}{2}$ in.) high, and 30.1 (12 in.) deep.

The board enclosures 30 are differentiated from each other by means of a removable index tab 56. The tabs 56 may include numbers or user-selected labels so the user may readily pick out the desired board 8, and, or storage device 6. In one preferred embodiment, the storage frames 30 are placed in a drawer 58 of a cabinet 60 (shown in phantom in FIG. 1). The cabinet 60 will have a variable number of drawers 58, the number depending of the system's flexibility, all the other circuit boards will be able to be stored in the same system.

Those skilled in the art will readily observe that numerous modifications and alterations of the system may be made while retaining the teachings of the invention. Accordingly, the above disclosure is not intended as limiting. The appended claims are therefore to be interpreted as encompassing the entire scope of the invention.

INDUSTRIAL APPLICABILITY

The printed circuit board storage system of the present invention is adaptable for use by any industry utilizing printed circuit board technology. Any operation using printed circuit boards will, by necessity, have to maintain an inventory of the boards.

The system of the present invention works by holding a printed circuit board 8 in a clamping mechanism 10. Since the clamping mechanism 10 is a locking device, the size and weight of the circuit board is not a significant factor. The board 8 and clamping mechanism 10 are surrounded by the board enclosure 30.

The protective sheets 38 of the board enclosure 30 protect the circuit board from physical damage. Because of the conductive properties of the board enclosure 30, the circuit board 8 is also protected from any harmful accumulation of static charge.

Multiple board enclosures 30 are placed in a storage frame 50. The different circuit boards 8 are identified by means of an index tab 56. The storage frames 50 are then enclosed in a cabinet 60. The cabinet 60 can be equipped with a nitrogen purge outlet 62 as an option for easy cleaning and dispelling harmful chemical fumes or dust.

The cabinets 60 may have a variable number of drawers 58, each drawer 58 holding a storage frame 50. This modular aspect of the overall design allows easy variability of the system's total storage capacity.

In summary, the storage system of the present invention provides high density storage for printed circuit boards of various sizes.

In most manufacturing operations, the circuit boards used will not all be of uniform size. Certainly in a rework or repair operation, where it is essential to have many different boards in one area, the present invention, capable of handling any size circuit board, would be of great utility. The modular design allows the system to be easily expanded, essential to any operation that is growing or simply handles a variable volume.

For all of the above reasons, it is expected that the printed circuit board storage system of the present invention will have general industrial applicability. Any operation using printed circuit boards and desiring to minimize storage space will find the present invention useful. Therefore, it is expected that the commercial utility of the present invention will be very widespread.

I claim:

1. A printed circuit board storage system apparatus adapted for providing high density circuit board storage, comprising:
a board enclosure structure for protecting the circuit boards during storage;
a clamping mechanism contained therein to hold the board in place within the board enclosure structure; and
wherein the clamping mechanism is located such that a wide variety of sizes and shapes of boards are adapted to be stored in an unhindered manner within the enclosure structure, wherein,
wherein, the clamping mechanism consists only of two jaw/handle members joined by a hinge pin with no spring-like mechanism being included.

2. The device of claim 1 wherein:
each of said jaw/handle members is constructed from a single metal rod formed into a generally rectangular shape.

3. The device of claim 1 wherein:
a symmetrical handle portion is formed by the upper end of each of said jaw/handle members so that the clamping mechanism may be grasped for transport.

4. The device of claim 3 wherein:
said handle portions serve as manipulative elements for operating a pair of associated contact jaw portions formed by the opposite end of said jaw/handle members.

5. The device of claim 4 wherein:
the clamping force is provided by a locking device used to secure said handle portions in a closed position.

6. The device of claim 4 wherein:
the jaws of the clamping mechanism are coated with a pliable substance to enhance their gripping capability.

7. The device of claim 1 wherein:
the support means of the board enclosure structure is composed of two parallel rails, notched at either end, and separated by spacer blocks.

8. The device of claim 7 wherein:
protective sheets are attached to the rails.

9. The device of claim 8 wherein:
said protective sheets are constructed of a flexible, electrically conductive material.

10. The device of claim 1 wherein:
a removable index tab is attached to the clamping mechanism to provide easy identification.

11. The device of claim 1 and further including:
a storage frame capable of supporting multiple board enclosures.

12. The device of claim 11 wherein:
said storage frame is constructed of flat conductive metal bars.

13. The device of claim 11 and further including:
an enclosing cabinet structure.

14. The device of claim 13 wherein:
said cabinet has multiple drawers, each enclosing a storage frame.

15. The device of claim 13 wherein:
said cabinet and storage frames are constructed of a conductive metal and grounded to dissipate static charge.

16. The device of claim 13 wherein:
the conductive metal is steel.

17. The device of claim 13 wherein:
the conductive metal is aluminum.

18. The device of claim 13 and further including:
a nitrogen purge attachment to facilitate cleaning.

* * * * *